US006788091B1

(12) United States Patent
Weber

(10) Patent No.: US 6,788,091 B1
(45) Date of Patent: Sep. 7, 2004

(54) METHOD AND APPARATUS FOR AUTOMATIC MARKING OF INTEGRATED CIRCUITS IN WAFER SCALE TESTING

(75) Inventor: David M. Weber, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 88 days.

(21) Appl. No.: 09/993,015

(22) Filed: Nov. 5, 2001

(51) Int. Cl.[7] .............................................. G01R 15/12
(52) U.S. Cl. ..................... 324/765; 324/158.1; 324/763
(58) Field of Search ................................ 324/765, 763, 324/767, 158.1, 73.1; 340/514

(56) References Cited

U.S. PATENT DOCUMENTS

| | | | | |
|---|---|---|---|---|
| 5,270,655 A | * | 12/1993 | Tomita ........................ | 324/767 |
| 5,355,081 A | * | 10/1994 | Nakata et al. ............... | 324/765 |
| 5,570,035 A | * | 10/1996 | Dukes et al. ................ | 324/763 |
| 6,060,897 A | * | 5/2000 | Shacham et al. ........... | 324/765 |

OTHER PUBLICATIONS

Kagaris, D. "The VLSI Handbook", Chapter 67 entitled ATPG and BIST, pp 67–1 through 67–14.

* cited by examiner

*Primary Examiner*—Vinh P. Nguyen
(74) *Attorney, Agent, or Firm*—Yee & Associates PC

(57) ABSTRACT

A mechanism if provided for testing newly-manufactured integrated circuits at the wafer stage. Built-in self-test circuitry is used to test each of the die on a wafer in parallel. Then, when a defect is detected, the die marks itself (e.g., by physically destroying a portion of itself through burnout). The present mechanism eliminates the inefficiencies of serial testing of die and of mechanical latency as each die is positioned for testing.

5 Claims, 4 Drawing Sheets

METHOD AND APPARATUS FOR AUTOMATIC MARKING OF INTEGRATED CIRCUITS IN WAFER SCALE TESTING

BACKGROUND OF THE INVENTION

1. Technical Field

The present invention is directed generally toward the testing of integrated circuit wafers. More specifically, the present invention is directed toward testing integrated circuit wafers in parallel using built-in self-test circuitry and self-marking technology.

2. Description of the Related Art

Integrated circuits (ICs) are typically manufactured in batches on a single disc of material, known as a wafer. One wafer may contain many die (the name commonly given to the individual ICs on a wafer). Environmental and other factors during the manufacturing process may and generally do cause defects in at least some of the circuits on any given wafer. An essential part of an the IC manufacturing process, then, is to detect defective ICs and discard them before they are packages for use within a circuit.

Generally, the die on a wafer are tested ("probed") by individually contacting contact pads on each die and executing a variety of functional, fault grade, automatic test pattern generation (ATPG) and parametric tests. If any of the tests fail, then the die is marked as bad. Testing then continues from die to die. For smaller devices, the test time can be acceptably short, and in some cases, the time required to mechanically move the test connection from die to die (mechanical latency) can be the most significant portion of the process. For more complex devices, the test times can be quite large.

What is needed, then, is a test technique that reduces mechanical latency and testing time.

SUMMARY OF THE INVENTION

The present invention addresses the problem of testing newly-manufactured integrated circuits at the wafer stage. Built-in self-test circuitry is used to test each of the die on a wafer in parallel. Then, when a defect is detected, the die marks itself (e.g., by physically destroying a portion of itself through burnout). The present invention eliminates the inefficiencies of serial testing of die and of mechanical latency as each die is positioned for testing.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
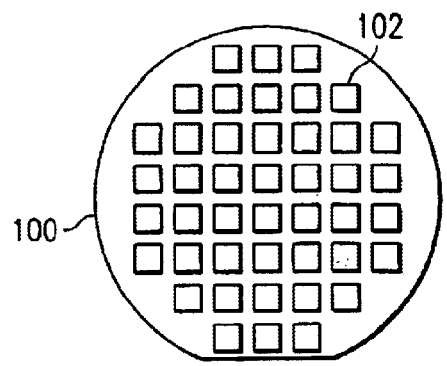
FIG. 1 is a depiction of a semiconductor wafer as it is known in the art.

With reference now to the figures and in particular with reference to FIG. 1, a conventional semiconductor wafer 100 is depicted. Wafer 100 is constructed from a monolithic piece of a semiconductor material, such as silicon, germanium, gallium arsenide, or the like. Wafer 100 contains a number of identical integrated circuits (called die), such as integrated circuit 102. Each of these integrated circuits will eventually be removed from wafer 100 and packaged for use within a circuit (e.g., on a printed circuit board).

Wafer 100 can be thought of as a "batch" of integrated circuits, analogous to a batch of cookies. A batch of cookies is usually made from a single amount of dough. Yet, as any baker will attest, even cookies made from the same bowl of dough will turn out differently. Some may be overdone, some underdone, some may have more chocolate chips than others. The same goes for a wafer of integrated circuits. Some will be too large in some features, some too small, and some simply will not work at all. The doping of regions may vary within devices on the integrated circuits. The variation of some may fall outside of acceptable tolerances, resulting in unacceptable performance. It is therefore critical that integrated circuits be tested before being packaged for use (which is costly).

Figure 2:
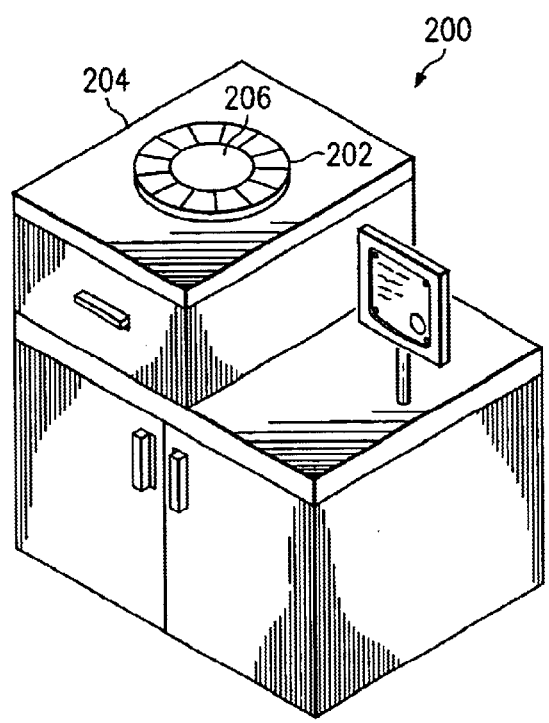
FIG. 2 is a depiction of a wafer prober as it is known in the art.

FIG. 2 is a depiction of a wafer prober (200) as it exists in the art. Wafer prober 200 is a testing device used to detect defects in the integrated circuits contained in a wafer. Wafer prober 200 includes a probe card 202, which contains a number of electrical contacts. Prober assembly 204 holds a wafer in place and positions the wafer under hug 206 of probe card 202 so as to engage the contacts with an integrated circuit on the wafer. Wafer prober 200 then applies a test pattern (a series of signals designed to test particular features of the integrated circuit) to the integrated circuit through the contacts on probe card 202. The integrated circuit is the monitored through contacts on probe card 202, so that its behavior may be noted. The observed behavior of the circuit is compared to an expected behavior, and if the two do not match, the integrated circuit is marked as defective. This is usually done by applying a dot of ink to the defective integrated circuit. Prober assembly 204 then repositions the wafer for another integrated circuit to be tested.

Figure 3:
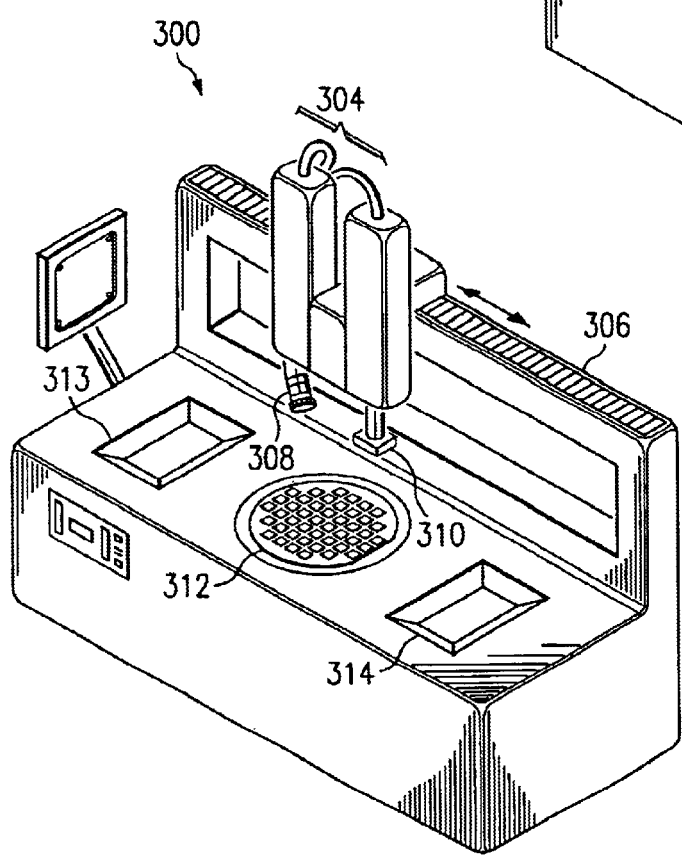
FIG. 3 is a depiction of a sorting device as it is known in the art.

Once wafer prober 200 has identified the defective integrated circuits on the wafer, it is then necessary to sort the defective integrated circuits out of the fully functional integrated circuits. FIG. 3 depicts a sorting device 300, as present in the art, for carrying out this function. Sorting device 300 contains a robotic assembly 304, which moves along a track 306. Robotic assembly 304 includes both a camera 308 and a manipulator 310. Camera 308 is used by sorting device 300 to visually spot the defective integrated circuits on wafer 312. Those circuits that are identified as defective (i.e., by their ink spots) are removed from wafer 312 by manipulator 310 and placed in tray 312. The remaining circuits are removed by manipulator 310 and placed in tray 314 before moving on the being packaged.

As can be seen, the conventional testing and sorting process depicted in FIGS. 2–3 involves two stages in which each integrated circuit on the wafer must be considered individually in sequence. This can be a slow process. It can also be prone to error under circumstances, since the wafer prober must correctly position itself with respect to each individual integrated circuit. A misalignment may result in false test results.

The present invention aims to simplify the process of testing integrated circuits so as to avoid the problems associated with individually testing and inking each defective circuit. The present invention is directed toward testing the integrated circuits on a wafer in parallel and allowing each defective integrated circuit to "mark itself" as defective.

Figure 4:
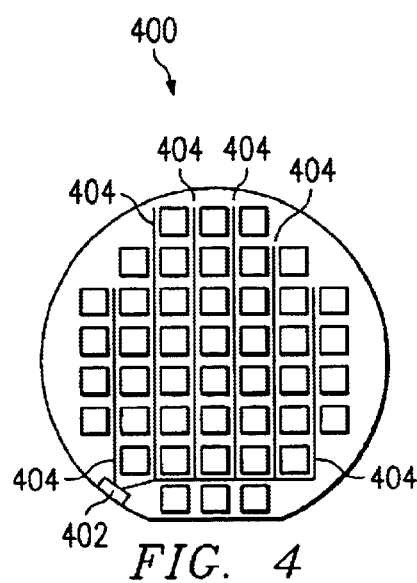
FIG. 4 is a diagram of a wafer in accordance with a preferred embodiment of the present invention.

FIG. 4 is a diagram depicting a wafer 400 in accordance with a preferred embodiment of the present invention. Wafer 400 includes an interface point 402, which allows the entire wafer to be connected to a testing device. Rather than having a wafer prober connect to each individual circuit, wafer 400 allows a testing device to connect through interface point 402, through signal paths 404, to each integrated circuit on wafer 400. Signal paths 404 preferably carry power, a clock signal, and any necessary control signals to the integrated circuits for the initiation of a built-in self-test (BIST) within each integrated circuit in parallel. Thus, wafer 400 will connect to a testing device through interface point 402, and the testing device will send power and signals through interface point 402 to initiate self-test procedures by the integrated circuits themselves.

Figure 5:
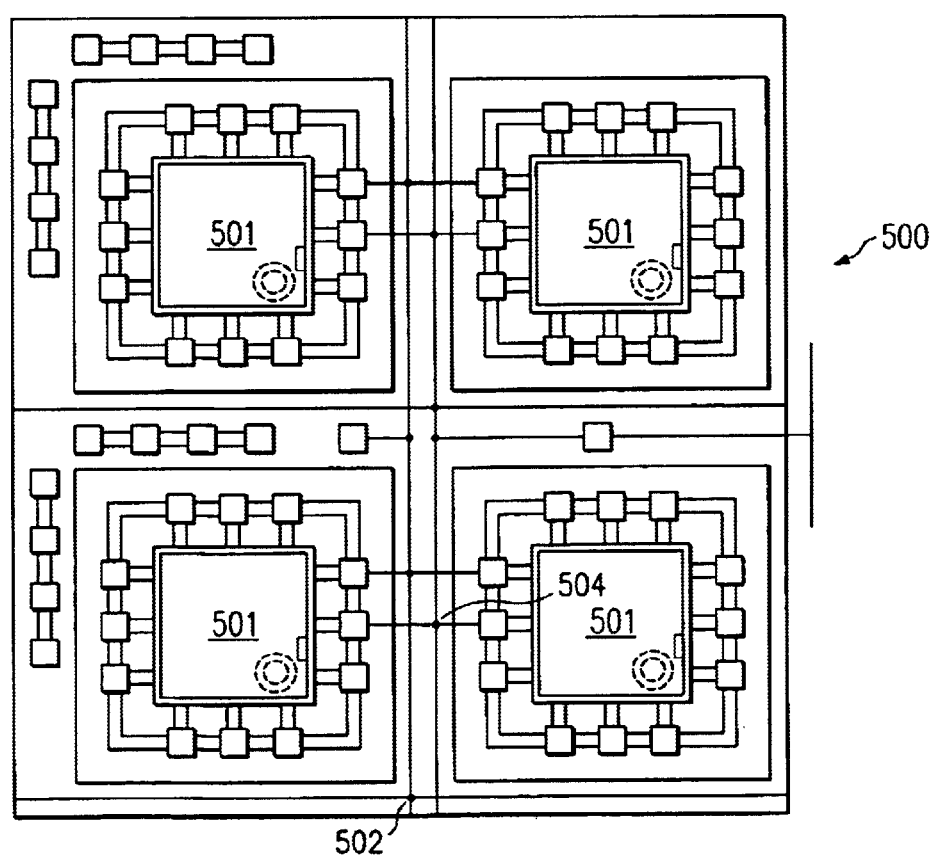
FIG. 5 is a diagram of a reticle in accordance with a preferred embodiment of the present invention.

FIG. 5 is a magnified view of a reticle 500 of integrated circuits from wafer 400. A reticle, as commonly used in the art, is a contiguous group of integrated circuits on a wafer that were manufactured simultaneously. One of ordinary skill in the art, however, will appreciate that the invention herein disclosed need not be practiced on a per-reticle basis; the integrated circuits may be tested in groups of any size, including over the entire wafer (perhaps containing many reticles) simultaneously. A reticle is depicted here for the purpose of conveniently displaying a group of integrated circuits.

Figure 6:
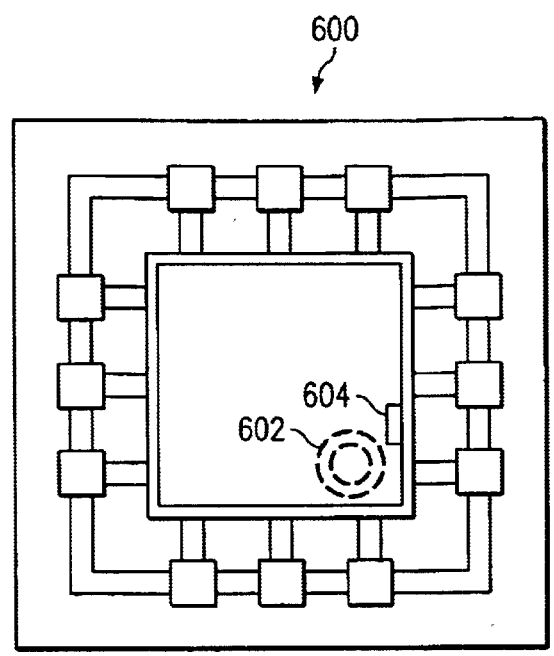
FIG. 6 is a diagram of a die in accordance with a preferred embodiment of the present invention.

Each of integrated circuits 501 is connected through connection points 504 to signal paths 502, which extend around and between integrated circuits 501. The introduction, by the testing device, of the proper signals in signal paths 502 will initiate a self-test procedure by built-in self-test (BIST) circuitry 602, shown as part of a further magnified integrated circuit 600 in FIG. 6. Signal paths 502 may be constructed as part of the normal manufacturing process used to create integrated circuits 501. For example, signal paths 502 may be constructed as part of a metal layer created during the normal manufacturing process used to make integrated circuits 501. Also, signal paths 502 may be constructed either on the die themselves, or off the die, on scroll lines, for instance. Scroll lines are lines along which the die are cut from the wafer.

BIST circuitry 602 executes its own test pattern, and if integrated circuit 600 does not respond properly to the test pattern generated by BIST circuitry 602, visible circuit component 604 will change in appearance (shown turning white in FIG. 5). Visible circuit component 604 may then be used to identify integrated circuit 600 as defective, rather than an ink dot.

It is important to note at this point that BIST circuitry 602 may comprise any type of built-in circuitry appropriate for the self-testing of a device. It is understood that the phrase "BIST," as used in the art, may carry a narrow meaning with regard to which tests the term represents. This document, however, takes abroad interpretation of the term that encompasses testing techniques of all kinds. The broad interpretation adopted here is more in keeping with the plain meaning of the words "built-in self-test," than that which may be more prevalent within the art.

Visible circuit component 604 is some type of component that can be made to change external appearance. In a preferred embodiment, visible circuit component 604 is a transistor or other circuit component that is made to burn out (i.e., a component that is destroyed, and thus changed in appearance, due to overheating; this is typically done by providing too much current to the device). A sufficiently large transistor, when made to burn out due to overcurrent, can be detected by a sorter camera (e.g., camera 308 in FIG. 3) so that the defective integrated circuit can be disposed of properly. In an alternative embodiment, an internal fuse or array of fuses (such as are used in programmable read-only memory circuits [PROMs]) may be used as visible circuit component 604 and made to blow out when the circuit is defective. One of ordinary skill in the art will recognize that any of a large number of components may be used as visible circuit component 604 without departing from the scope and spirit of the invention. Any circuit component that can change its appearance will do.

Figure 7:
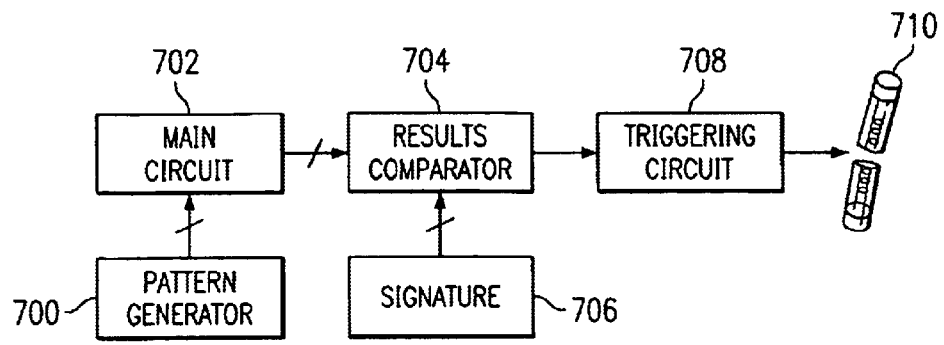
FIG. 7 is a block diagram describing the operation of built-in self-test circuitry in accordance with a preferred embodiment of the present invention.

FIG. 7 is a block diagram describing the operation of built-in self-test circuitry in accordance with a preferred embodiment of the present invention. Pattern generator 700 generates a test pattern to be applied to main circuit 702, which is under test. In a digital integrated circuit, pattern generator 700 will preferably generate a pseudorandom sequence of bits to apply to main circuit 702, through the use of a linear feedback shift register (LFSR), for example. Main circuit 702 will, in response to the generated pattern, produce certain results, which are read into results comparator 704. Results comparator 704 calculates a signature value based on the results of main circuit 702, through the use of a multi-input signature register (MISR), for example. This signature value acts as a kind of checksum, and results comparator 704 compares its calculated signature value with a pre-calculated signature value 706 to determine whether main circuit 702 is functioning properly. If the calculated signature matches signature value 706, main circuit 702 is functioning properly. If not, main circuit 702 is faulty. In the event that results comparator 704 determines that main circuit 702 is faulty, results comparator 704 will activate triggering circuit 708, which modifies the external appearance of the circuit by, for example, blowing a fuse 710.

Figure 8:
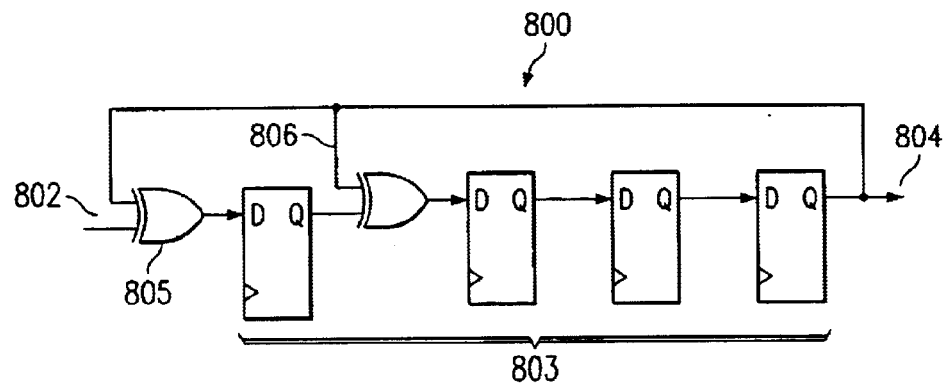
FIG. 8 is a schematic of a linear-feedback shift register used in a preferred embodiment of the present invention.

FIG. 8 is a depiction of a linear-feedback shift register (LFSR) 800 as may be used in a preferred embodiment of the present invention. Input 802 is fed through a series of flip-flops 803, which are connected in a circular structure by feeding output 804 back into exclusive-or gate 805 into flip-flops 803. A number of additional connections from output 804, such as connection 806 may be made through exclusive-or gates into flip-flops within the series, as shown.

LFSR 800 takes a sequence of bits as input and outputs a sequence of bits whose values are a function of the entire sequence of bits fed into LFSR 800.

To put it simply, LFSR 800 uses feedback to make its current output a function of its entire past. This phenomenon is typically exploited (in cryptography, for instance) so as to make LFSR 800 act as a pseudorandom number generator. An LFSR such as LFSR 800 may be used to produce a pseudorandom test pattern to be applied to the circuit to be tested (i.e., can be used as pattern generator 700 in FIG. 7).

Figure 9:
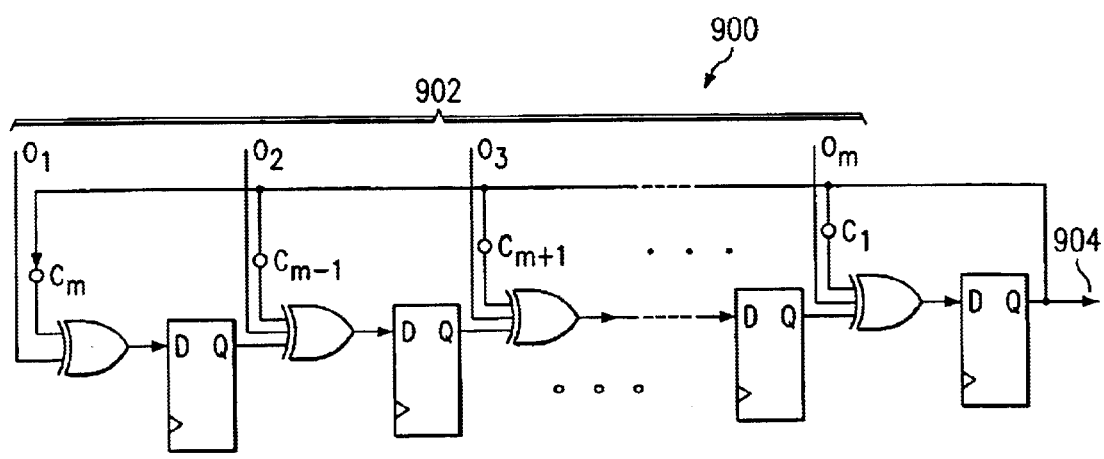
FIG. 9 is a schematic of a multiple input shift register in accordance with a preferred embodiment of the present invention.

FIG. 9 is a diagram depicting a multiple-input signature register (MISR) 900 that may be used in a preferred embodiment of the present invention. MISR 900 takes multiple inputs 902 and applies feedback to achieve a stream of bits at output 904 that is a function of both current inputs and all past inputs to MISR 900. This phenomenon allows MISR 900 to be used to calculate a signature (as a series of bits from output 904) from circuit test results. This signature, being a function of the entire sequence of data input into MISR 900, can be an effective error-detecting code for detecting discrepancies in the data input into MISR 900. This signature can then be compared with a reference value (e.g., signature value 706 in FIG. 7) to detect whether a fault has occurred in the tested circuit.

Figure 10:
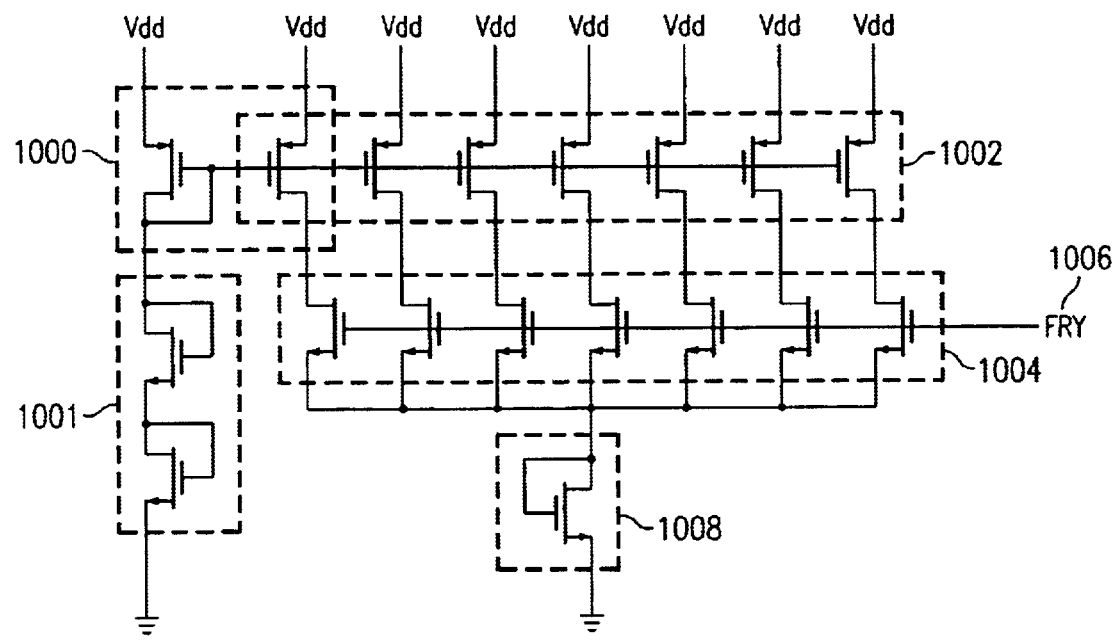
FIG. 10 is a schematic of a triggering circuit in accordance with a preferred embodiment of the present invention.

FIG. 10 is a diagram of a triggering circuit that may be used in a preferred embodiment of the present invention to make a visible change to the appearance of the circuit. FIG. 10 is shown implemented in an enhancement-mode metal-oxide semiconductor (MOS) technology, although one of ordinary skill in the art will appreciate that the basic principles depicted in FIG. 10 may be applied to any suitable electronic technology, such as bipolar transistors, junction field-effect transistors, and the like.

Current mirror 1000 is biased by diode-connected transistors 1001 to make transistors 1002 act as current sources providing identical currents. Current mirror 1000 and transistors 1002 are preferably connected to a high-output power supply through the testing device, so as to be able to apply large amounts of current to the visible component to be destroyed (diode-connected transistor 1008). Transistors 1002 are constructed so as to be able to withstand the amount of current produced by current mirror 1000 through each of transistors 1002, but the sum of the currents provided by transistors 1002 are enough to destroy diode-connected transistor 1008. Transistors 1004 are under normal operation turned off, so that no current flows through transistors 1002. When a sufficient voltage is applied at "FRY" input 1006 (from results comparator 704, for instance), transistors 1004 turn on, and the sum of the currents through transistors 1002 is made to flow through diode-connected transistor 1008, causing diode-connected transistor 1008 to burn up and leave a visible mark on the integrated circuit. Alternatively, a fuse or other device may be used in place of diode-connected transistor 1008.

Figure 11:
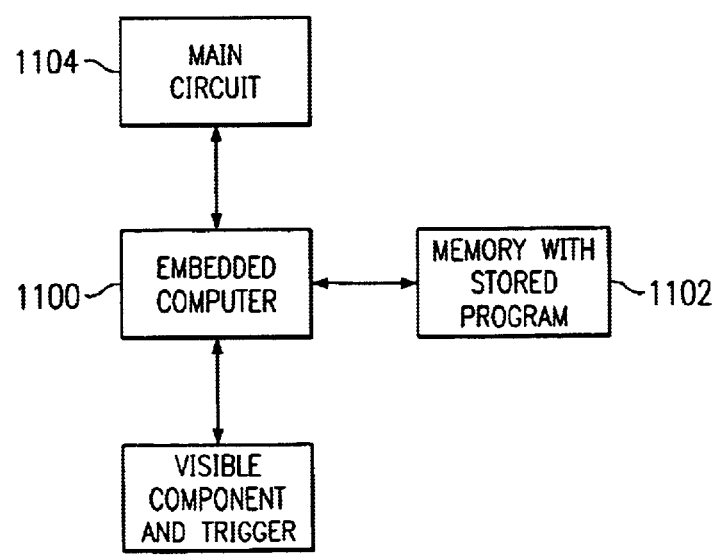
FIG. 11 is a block diagram of an alternative embodiment of the present invention utilizing a stored-program embedded computer.

While the embodiments so far presented have focused on the use of "hard-wired" circuitry for determining defects and making visible changes to an integrated circuit, it is also within the spirit and scope of the invention to employ an embedded stored-program computer to execute the testing and marking process. FIG. 11 is a simplified block diagram of an embedded stored-program computer system for testing an integrated circuit. An embedded computer 1100 executes a stored program from memory 1102. This program includes instructions for generating a test pattern, which is applied to main circuit 1104. The program also contains instructions for calculating a signature from results of main circuit 1104. The signature can then be compared by embedded computer 1100 with a signature stored in memory 1102. The visible component and trigger 1106 maybe activated by embedded computer 1100 if the signatures do not match. It is worth noting that if memory 1102 is stored as a programmable read-only memory (PROM), which relies on the use of fuses, memory 1102 may serve as the visible component as well as memory for the stored program, since all (or at least additional ones of the fuses of memory 1102 may be blown in the event that there is no match.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A wafer for testing by a testing device, the wafer comprising:

a plurality of integrated circuits, wherein each integrated circuit includes testing circuitry;

a network of signal paths on the wafer, wherein the network of signal paths connects the plurality of integrated circuits to two or more connection points;

a current mirror; and a plurality of transistors, wherein in response to the testing device being connected to the connection points, the testing circuitry performs a test on the plurality of integrated circuits concurrently, wherein each integrated circuit includes at least one visible component having an appearance and wherein the at least one visible component permanently changes its appearance in response to failing the test, wherein the at least one visible component includes at least one diode-connected transistor, wherein the current mirror receives a high current and passes an equal amount of current to each of the plurality of transistors, and wherein the plurality of transistors, responsive to an input signal, pass current to the diode-connected transistor, causing the diode-connected transistor to burn up and leave a visible mark.

2. The wafer of claim 1, wherein the network of signal paths includes a power supply signal path.

3. The wafer of claim 1, wherein the network of signal paths includes a clock signal path.

4. The wafer of claim 1, wherein the network of signal paths includes a control signal path.

5. The wafer of claim 1, wherein the network of signal paths is located on a scroll line.

* * * * *